United States Patent [19]
Hoffman et al.

[11] Patent Number: 5,130,642
[45] Date of Patent: Jul. 14, 1992

[54] HANGING AMMETER WITH REMOVABLE BATTERY CARTRIDGE

[75] Inventors: Mark R. Hoffman, Lake Forest; Niels C. Pedersen, Jr., Spring Grove, both of Ill.

[73] Assignee: HD Electric Company, Deerfield, Ill.

[21] Appl. No.: 714,565

[22] Filed: Jun. 13, 1991

[51] Int. Cl.⁵ .................. G01R 1/04; G01R 11/04; H01R 13/48; H01M 2/10
[52] U.S. Cl. ................................ 324/127; 324/156
[58] Field of Search .............. 324/127, 129, 149, 156, 324/157; 361/380, 392

[56] References Cited
U.S. PATENT DOCUMENTS
4,297,635 10/1981 Stevens ............................ 324/156

Primary Examiner—Walter E. Snow
Attorney, Agent, or Firm—Emrich & Dithmar

[57] ABSTRACT

The ammeter includes a tubular housing with a hook-shaped sensor secured thereto at one end thereof and coupled to battery-powered digital ammeter circuitry disposed within the housing. The other end of the housing is open and receives telescopically therein a cylindrical cartridge which includes either a cradle or a recess supporting a replaceable battery and carrying connectors for connecting the battery to the ammeter circuitry. A universal spline coupler is telescopically received in a bore in the cartridge and projects from the tubular housing when the cartridge is disposed therein for coupling to associated equipment, such as a hot stick.

17 Claims, 1 Drawing Sheet

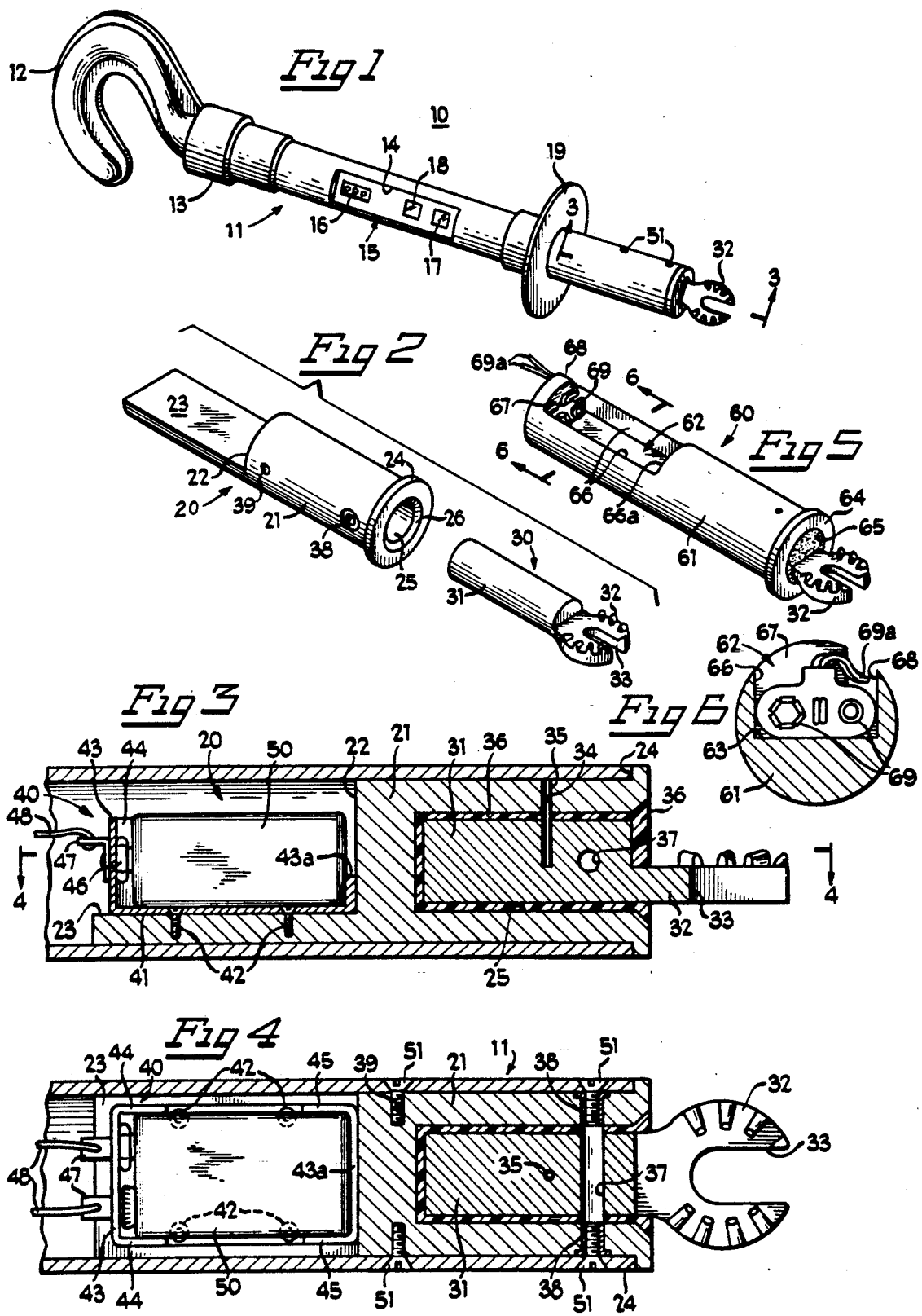

HANGING AMMETER WITH REMOVABLE BATTERY CARTRIDGE

BACKGROUND OF THE INVENTION

1. Field of the Invention

The present invention relates to ammeters for measuring the current in electric utility power lines and, in particular, relates to hanging-type ammeters which include hook-shaped sensors which hook onto overhead conductors with the aid of a hot stick or the like.

2. Description of the Prior Art

A prior hanging ammeter, sold by the assignee of this application, includes an elongated tubular housing having a hook-shaped sensor at one end thereof which is coupled to battery-powered ammeter circuitry disposed within the tubular housing. A rechargeable battery for powering the circuitry is also disposed within the housing, the open end of which housing is adapted to receive one end of an extension adapter rod, the other end of which is provided with a universal spline joint for coupling to a hot stick. When the adapter is removed from the housing, a plug of a battery charger may be inserted in the open end of the housing and received in a receptacle therein for charging the battery. This prior arrangement is expensive and complicated since it requires the use of the adapter rod and a relatively expensive rechargeable battery and a charging unit therefor.

SUMMARY OF THE INVENTION

It is a general object of the present invention to provide an improved hanging ammeter which avoids the disadvantages of prior constructions while affording additional structural and operating advantages.

An important feature of the invention is the provision of a hanging ammeter which is usable directly with a hot stick or the like without the use of an adapter rod.

Still another feature of the invention is the provision of a hanging ammeter of the type set forth which is powered by a replaceable battery.

In connection with the foregoing feature, another feature of the invention is the provision of an ammeter of the type set forth which provides a removable cartridge which carries both a replaceable battery and a coupler for coupling to associated equipment.

These and other features of the invention are attained by providing in a hanging ammeter for overhead power lines including a tubular housing open at one end thereof and carrying a hook-shaped sensor at the other end thereof, and battery-powered ammeter circuitry disposed in the housing and coupled to the sensor, the improvement comprising: an adapter cartridge receivable in the open end of the housing for closing same, battery support means on the cartridge for carrying an associated battery, means on the cartridge for electrically connecting the battery to the ammeter circuitry, attachment means for securing the cartridge to the housing, and coupling means carried by the cartridge and adapted for coupling the housing to associated equipment.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there are illustrated in the accompanying drawings preferred embodiments thereof, from an inspection of which, when considered in connection with the following description, the invention, its construction and operation, and many of its advantages should be readily understood and appreciated.

FIG. 1 is a perspective view of a hanging ammeter having a replaceable battery cartridge and constructed in accordance with and embodying the features of the present invention;

FIG. 2 is an enlarged, exploded, perspective view of a portion of a replaceable cartridge of the ammeter of FIG. 1 in accordance with a first embodiment of the invention;

FIG. 3 is a further enlarged, fragmentary, sectional view taken along the line 3—3 in FIG. 1, and illustrating the cartridge construction of FIG. 2;

FIG. 4 is a sectional view taken along the line 4—4 in FIG. 3;

FIG. 5 is a perspective view of a replaceable cartridge in accordance with a second embodiment of the invention; and FIG. 6 is an enlarged view in vertical section taken along the line 6—6 in FIG. 5.

DESCRIPTION OF THE PREFERRED EMBODIMENTS

Referring to FIG. 1 there is illustrated a hanging ammeter 10 constructed in accordance with the present invention. The ammeter 10 includes an elongated tubular housing 11, preferably formed of an electrically insulating material, such as fiberglass. A hook-shaped sensor 12 is fixedly secured to the housing at one end thereof by suitable means (not shown), a reinforcing collar 13 being provided to strengthen the joint therebetween. The housing 11 has a rectangular opening 14 therein intermediate the ends thereof. The sensor 12 has an electrically insulating outer covering and includes a current sensor which is coupled to ammeter circuitry 15 disposed within the tubular housing 11. The details of the ammeter circuitry are well known and not shown, but it has a panel disposed in the opening 14 and including a digital readout display 16, an ON/RESET button 17 for activating the circuitry and resetting the display 16, and an OFF button 18 for deenergizing the circuitry. The ammeter 10 is adapted to be coupled to an associated holder, such as a hot stick, to enable a user to reach an overhead power line with the hook-shaped sensor 12. The ammeter 10 is provided with a guard 19 formed of electrically insulating material, such as rubber, and encircling the tubular housing 11 and extending radially outwardly therefrom for dissipating any electric charge which may be present on the surface of the tubular housing 11 and preventing it from reaching the associated holder.

Referring now also to FIGS. 2-4, the ammeter 10 includes a removable cartridge 20 which has a solid cylindrical body 21 formed of an insulating material, such as fiberglass, and cutaway at one end thereof to provide a rectangular notch or recess 22 defining a flat rectangular support surface 23 parallel to the longitudinal axis of the body 21. Projecting radially outwardly from the cylindrical body 21 at the other end thereof is an annular flange 24. The body 21 has an outer diameter very slightly less than the inner diameter of the tubular housing 11, while the flange 24 has an outer diameter substantially equal to that of the tubular housing 11, so that the cylindrical body 21 may be telescopically received in the open end of the housing until that end abuts against the flange 24. Formed coaxially in the flanged end of the body 21 is a cylindrical bore 25 which has a chamfered entry surface 26 and telescopically receives one end of the cylindrical shaft 31 of a coupler 30. The shaft 31 is provided at the other end thereof with a flat universal spline tongue 32 provided with an axial slot 33.

In assembly, epoxy 36 (FIG. 3) is placed in the bore 25 and the shaft 31 is embedded therein, with the plane of the spline end 32 substantially parallel to the support surface 23, until the outer end of the shaft 31 is substantially coplanar with the inner edge of the chamber 26. The bore 25 is then filled with epoxy 36 around the shaft 31 until the outer surface of the epoxy 36 is substantially coplanar with the outer end of the cylindrical body 21 to form a rigid unitary structure when the epoxy 36 has set. To ensure that the coupler 30 is fixedly secured to the body 31, a bore 34 is drilled diametrically into the body 21 and about half way through the shaft 31 substantially perpendicular to the plane of the spline tongue 32, and a roll pin 35 is driven into the bore 34 to prevent any movement of the coupler 30 with respect to the cylindrical body 21. A cylindrical bore 37 may be drilled diametrically through the cylindrical body 21 and the shaft 31 perpendicular to the roll pin 3 and internally threaded grommets 38 may be fitted respectively in the opposite ends of the bore 37. Internally threaded bores 39 are also formed in the shaft 31 adjacent to the recess 22 and substantially parallel to the bore 37.

The cartridge 20 also includes a cradle 40 which includes a flat rectangular base 41 seated on the support surface 23 and fixedly secured thereto as by suitable fasteners, such as screws 42. Respectively integral with the base 41 at the opposite ends thereof are upstanding end walls 43 and 43a. The end wall 43 is integral at the opposite side edges thereof with side walls 44 which project toward the opposite end of the base 41. The end wall 43a is integral at its opposite side edges with side walls 45 which respectively project toward the side walls 44 substantially coplanar therewith. Fixedly secured to the end wall 43 are male and female connectors 46 respectively adapted for coupling at the female and male terminals of a battery, such as a 9-volt battery. Each of the connectors 46 includes a tab 47 which extends outwardly from the end wall 43, the tabs 47 being respectively adapted to be electrically connected, as by soldering, to conductors 48 of the ammeter circuitry 15. It will be appreciated that the base 41 and the walls 43-45 cooperate to define, a receptacle for an associated 9-volt battery 50, the cradle 40 being dimensioned to snugly receive the battery 50 when its terminals are engaged with the connectors 46.

The cartridge 20 is adapted to be received telescopically in the open end of the tubular housing 11, with the plane of the spline tongue 32 parallel to the rectangular opening 14, the cartridge 20 being secured in place by screws 51 which extend through complementary openings in the tubular housing 11 and threadedly engage in the grommets 38 and the bores 39.

In use, the spline tongue 32 is adapted to be matingly engaged with a complementary spline tongue on associated equipment, such as a hot stick, and secured thereto in any desired angular orientation by an associated bolt, in a known manner. The user presses the ON/RESET button 17 to activate the ammeter circuitry 15, and then the hot stick is used to raise the ammeter 10 into position for hooking the sensor 12 over a conductor and sensing the current through the conductor. The magnitude of the current is measured by the ammeter circuitry 15 and displayed on the digital display 16, the ammeter circuitry 15 being of the latching type so as to record the highest level of current being measured. The user then reads the measured current from the display after the ammeter has been removed from the conductor. Pressing the ON/RESET button 17 again will reset the display 16 to zero, while pressing the OFF button will de-energize the ammeter circuitry 15.

When the battery 50 is exhausted so that it can no longer power the ammeter circuitry 15, it can easily be replaced by simply removing the screws 51 and then sliding the cartridge 20 out from the end of the tubular housing 11. It will be appreciated that, for this purpose, the conductors 48 are of sufficient length to permit the battery cradle 40 to clear the tubular housing while still maintaining connection between the ammeter circuitry 15 and the connectors 46. The battery 50 is replaced with a new battery and the cartridge 20 is reinserted in the tubular housing 11 and secured in place by the fasteners 51.

Referring now to FIGS. 5 and 6, there is illustrated an alternative form of cartridge, generally designated by the numeral 60, which has a solid cylindrical body 61 which is substantially the same as the body 21 of the cartridge 20, described above. The body 61 has a generally rectangular recess 62 cut thereinto adjacent to one end thereof so as to define a substantially rectangular, flat bottom support surface 63 The body 61 has an annular flange 64 at the other end thereof and has formed coaxially in that end a bore 65 for receiving the coupler 30. The recess 62 defines upstanding side walls 66, a forward end wall 66(a) and a rear end wall 67, the recess forming a cradle for the battery 50. The end wall 67 has a notch 68 therethrough at one side thereof. Fixedly secured to the inner surface of the end wall 67 are a pair of battery terminal connectors 69 like the connectors 46, respectively coupled by conductors 69a of the ammeter circuitry 15, the conductors 69a being passed through the notch 68 so as not to interfere with the snug fit of the cartridge 60 in the tubular housing 11. It will be appreciated that the coupler 30 may be pinned to the cylindrical body 61 of the cartridge 60 in the same manner as was described above in connection with the cartridge 20

From the foregoing, it can be seen that there has been provided an improved hanging ammeter which is of simple and economical construction and permits the use o a replaceable battery and does not require the use of an adapter rod.

We claim:

1. In a hanging ammeter for overhead power lines including a tubular housing open at one end thereof and carrying a hook-shaped sensor at the other end thereof, and battery-powered ammeter circuitry disposed in the housing and coupled to the sensor, the improvement comprising: an adapter cartridge receivable in the open end of the housing for closing same, battery support means on said cartridge for carrying an associated battery, means on said cartridge for electrically connecting the battery to the circuitry, attachment means for securing said cartridge to the housing, and coupling means carried by said cartridge and accessible from outside the housing when said cartridge is disposed in the housing.

2. The ammeter of claim 1 wherein said cartridge includes a solid cylindrical body telescopically receivable in the open end of the tubular housing.

3. The ammeter of claim 2, wherein said body is formed of electrically insulating material.

4. The ammeter of claim 2, wherein said body has an axial bore formed in one thereof, said coupling means including a cylindrical shaft receivable coaxially in said bore.

5. The ammeter of claim 4, and further including roll pin means fixedly securing said shaft to said cartridge body.

6. The ammeter of claim 4, and further comprising a universal spline integral with said shaft at the other end thereof and projecting from said cartridge body.

7. The ammeter of claim 4, and further comprising epoxy means received in said bore in surrounding relationship with said shaft for securing said shaft to said body.

8. The ammeter of claim wherein said battery support means includes a cradle carried by said cartridge and adapted for receiving a battery therein.

9. The ammeter of claim 8, wherein said means for electrically connecting includes terminal means carried by said cradle and adapted for connection to the associated battery and to the ammeter circuitry.

10. The ammeter of claim 1, wherein said battery support means includes a recess formed in said cartridge.

11. The ammeter of claim 10, wherein said means for electrically connecting includes terminal means mounted in said recess and adapted for connection to the associated battery and to the ammeter circuitry.

12. The ammeter of claim 11, wherein said cartridge includes wall structure defining said recess, said wall structure having a notch formed therein at one end thereof and opening into said recess, said means electrically connecting including conductors disposed through said notch and interconnecting said terminal means and the ammeter circuitry.

13. The ammeter of claim 1, wherein said attachment means includes a plurality of threaded fasteners received radially through complementary openings in the tubular housing and said cartridge.

14. The ammeter of claim 1, and further comprising a battery replaceably receivable in said battery support means.

15. The ammeter of claim 1, and further comprising electrically insulating diffuser means encircling said tubular housing and extending radially outwardly therefrom for diffusing surface electrical charge therefrom.

16. The ammeter of claim 1, and further comprising reinforcing collar means surrounding the tubular housing at said other end thereof for providing a strengthened joint between the tubular housing and the sensor.

17. The ammeter of claim 1, wherein the ammeter circuitry is digital circuitry and includes a digital display means.

* * * * *

UNITED STATES PATENT AND TRADEMARK OFFICE
CERTIFICATE OF CORRECTION

PATENT NO. : 5,130,642

DATED : July 14, 1992

INVENTOR(S) : Mark R. Hoffman et al.

It is certified that error appears in the above-identified patent and that said Letters Patent is hereby corrected as shown below:

Column 4, line 67, after "the" insert --ammeter--; and

Column 5, line 26, after "claim" insert --1,--.

Signed and Sealed this

Fourteenth Day of September, 1993

Attest:

BRUCE LEHMAN

Attesting Officer     Commissioner of Patents and Trademarks